US006750078B2

(12) United States Patent
Ma

(10) Patent No.: US 6,750,078 B2
(45) Date of Patent: Jun. 15, 2004

(54) MEMS SWITCH HAVING HEXSIL BEAM AND METHOD OF INTEGRATING MEMS SWITCH WITH A CHIP

(75) Inventor: Qing Ma, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/007,941

(22) Filed: Nov. 2, 2001

(65) Prior Publication Data

US 2003/0085109 A1 May 8, 2003

(51) Int. Cl.$^7$ ................................................ H01L 21/00
(52) U.S. Cl. .......................................... 438/52; 257/414
(58) Field of Search ............................ 333/262; 438/52

(56) References Cited

U.S. PATENT DOCUMENTS 6,396,368 B1 * 5/2002 Chow et al. ................ 333/262
6,535,663 B1 * 3/2003 Chertkow .................... 385/18

OTHER PUBLICATIONS

Chris Keller, Microfabricated High Aspect Ratio Silicon Flexures, HESXIL, RIE, and KOH Etched Desgin & Fabrication, MEMS Precision Instruments, CA 1998, pp. 23–44, 133–139 and 141–153.*

* cited by examiner

*Primary Examiner*—W. David Coleman
(74) *Attorney, Agent, or Firm*—Schwegman, Lundberg, Woessner & Kluth, P.A.

(57) ABSTRACT

A microelectromechanical system (MEMS) switch has a beam with a high-resonance frequency. The MEMS switch includes a substrate having an electrical contact and a hexsil beam coupled to the substrate in order to transfer electric signals between the beam and the contact when an actuating voltage is applied to the switch. A method of fabricating a MEMS switch includes forming a substrate having a contact and forming a beam. The method further includes attaching the beam to the substrate such that the beam is, maneuverable into and out of contact with the substrate.

23 Claims, 7 Drawing Sheets

MEMS SWITCH HAVING HEXSIL BEAM AND METHOD OF INTEGRATING MEMS SWITCH WITH A CHIP

FIELD OF THE INVENTION

The present invention relates to microelectromechanical systems (MEMS), and in particular to MEMS switches that have a connecting beam with a high resonance frequency to provide high-speed switching.

BACKGROUND OF THE INVENTION

A microelectromechanical system (MEMS) is a microdevice that integrates mechanical and electrical elements on a common substrate using microfabrication technology. The electrical elements are formed using known integrated circuit fabrication techniques while the mechanical elements are fabricated using lithographic techniques that selectively micromachine portions of a substrate. Additional layers are often added to the substrate and then micromachined until the MEMS device is in a desired configuration. MEMS devices include actuators, sensors, switches, accelerometers, and modulators.

MEMS switches have intrinsic advantages over conventional solid-state counterparts, such as field-effect transistor switches. The advantages include low insertion loss and excellent isolation. However, MEMS switches are generally much slower than solid-state switches. This speed limitation precludes applying MEMS switches in certain technologies, such as wireless communications, where sub-microsecond switching is required.

MEMS switches include a suspended connecting member called a beam that is electrostatically deflected by energizing an actuation electrode. The deflected beam engages one or more electrical contacts to establish an electrical connection between isolated contacts. When a beam is anchored at one end while being suspended over a contact at the other end, it is called a cantilevered beam. When a beam is anchored at opposite ends and is suspended over one or more electrical contacts, it is called a bridge beam.

The key feature of a MEMS switch that dictates its highest possible switching speed is the resonance frequency of the beam. The resonance frequency of the beam is a function of the beam geometry. The beams in conventional MEMS switches are formed in structures that are strong and easy to fabricate. These beam structures are suitable for many switching applications, however the resonance frequency of the beams is too low to perform high-speed switching.

FIG. 1 illustrates a prior art MEMS switch 10 that includes a cantilever beam 12. The beam 12 consists of a structural portion 14 and a conducting portion 16. High-speed MEMS switches require both strength and high conductivity making it necessary to use the composite beam 12. The MEMS switch 10 further includes an actuation electrode 18 and a signal contact 20 that are each mounted onto a base 22. One end 24 of the beam 12 is connected to the base 22 and the other end 26 of the beam 12 is suspended over the signal contact 20. The suspended end 26 of the beam 12 moves up and down when a voltage is applied to the actuation electrode 18. As the end 26 of the beam 12 moves up and down, the conducting portion 16 of the beam 12 engages and disengages the signal contact 20.

FIG. 2 illustrates the prior art MEMS switch 10 during fabrication. The MEMS switch 10 includes a release layer 28 that is removed by conventional techniques such as etching. Removing the release layer 28 exposes the actuation electrode 18, the signal contact 20, and the conducting portion 16 of the beam 12. The conducting portion 16 of the beam 12 and the contacts 18, 20 are usually made of the same acid resistant metal because they must withstand the process of removing the release layer 28. Gold is the most commonly used material for the conducting portion 16, the actuation electrode 18, and the signal contact 20.

The MEMS switch 10 typically needs to operate in excess of 10 billion switching cycles such that the repeated contact between the signal contact 20 and the conducting portion 16 of the beam 12 is a critical design consideration. There are many mechanisms that contribute to the aging and failure of contacts. These mechanisms include mechanical impact damage, sliding-friction induced damage, current-assisted interface bonding, solid-state reaction, and even local melting. When the conducting portion 16 and signal contact 20 are made of the same metal, they tend to bond each other such that the switch 10 oftentimes does not open at the appropriate time, especially if the contacts are made of a very soft material such as gold. Gold bonding can easily occur at room temperature such that the operating life of existing MEMS switches is typically below 1 billion switching cycles.

DETAILED DESCRIPTION OF THE INVENTION

The present invention relates to microelectromechanical systems (MEMS) that include a connecting beam with a high resonance frequency to provide high-speed switching. The connecting beam can be used for MEMS contact switches, relays, shunt switches and any other type of MEMS switch.

In the following detailed description of the invention, reference is made to the accompanying drawings in which is shown by way of illustration specific embodiments in which the invention may be practiced. These embodiments are described in sufficient detail to enable those skilled in the art to practice the invention. Other embodiments may be utilized and changes made without departing from the scope of the present invention. The following detailed description is not to be taken in a limiting sense, and the scope of the present invention is defined only by the appended claims.

Figure 3:
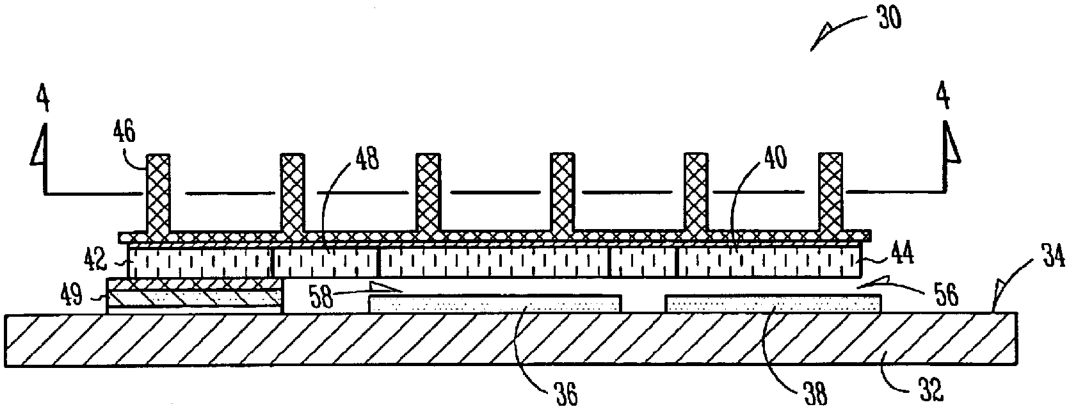
FIG. 3 is a cross-sectional view illustrating a MEMS switch of the present invention.
Figure 4:
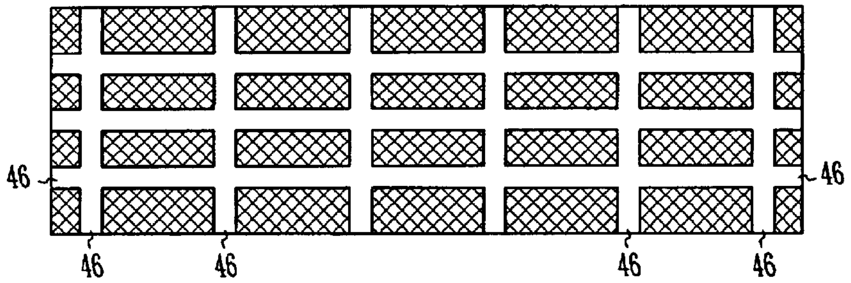
FIG. 4 is a cross-sectional view of the MEMS switch shown in FIG. 3 taken along line 4—4.

FIGS. 3 and 4 show a MEMS switch 30 according to the present invention. Switch 30 includes a substrate 32 with an upper surface 34. The substrate 32 may be part of a chip or any other electronic device. An actuation electrode 36 and a signal contact 38 are formed on the upper surface 34 of substrate 32. The actuation and signal contacts 36, 38 are electrically connected with other electronic components via conducting traces in the substrate 32, or through other conventional means.

Switch 30 further includes a cantilevered beam 40 having a closed end 42 and an open end 44. Beam 40 includes a hexsil structural portion 46 and a conducting portion 48 that is layered onto the hexsil structural portion 46. The conducting portion 48 of the beam 40 is mounted to a bonding pad 49 on the substrate 32 at the closed end 42 of the beam 40. The conducting portion 48 of the beam 40 is mounted such that its open end 44 is suspended in cantilever fashion over at least a portion of the signal contact 38. Mounting the beam 40 in this manner forms a gap 56 between the beam 40 and signal contact 38. In one embodiment gap 56 is anywhere from 0.5 to 2 microns. The conducting portion 48 of the beam 40 is also suspended over actuation electrode 36 such that there is a gap 58 between the actuation electrode 36 and the conducting portion 48 of the beam 40. The gap 58 is sized so that the actuation electrode 36 is in electrostatic communication with the conducting portion 48.

MEMS switch 30 operates by applying a voltage to actuation electrode 36. The voltage creates an attractive electrostatic force between actuation electrode 36 and beam 40 that deflects beam 40 toward the actuation electrode 36. Beam 40 moves toward the substrate 32 until the open end 44 of the beam 40 engages the signal contact 38 and establishes an electrical connection between the beam 40 and substrate 32.

The highest frequency at which a beam can be electrostatically deflected is the resonance frequency of the beam. The physical structure of a beam determines the resonance frequency of a beam. Conventional MEMS switches are typically too slow because the resonance frequency of the beams that are used in the switches are too low. The MEMS switch 30 of the present invention has a relatively high switching frequency because of a higher stiffness/mass ratio of the beam 40.

Since stiff structures require higher actuation voltage for the switching action, it is preferable to reduce the mass of the beam 40. The hexsil structural portion 46 of the beam 40 is relatively stiff and has a low density thereby improving the stiffness/mass ratio of the beam 40. Even though the stiffness/mass ratio of the beam 40 improves when the structural portion 46 of the beam 40 is partially formed in a hexsil pattern, the beam 40 has a relatively low stiffness. Therefore, the beam 40 has a high resonance frequency and a low actuation voltage. The higher resonance frequency of the beam 40 improves the switching speed of the MEMS switch 30. As an example, the walls that make up the hexsil structural portion 46 of the beam 40 are between 5 to 10 microns high and 0.1 to 1 microns wide.

Figure 5:
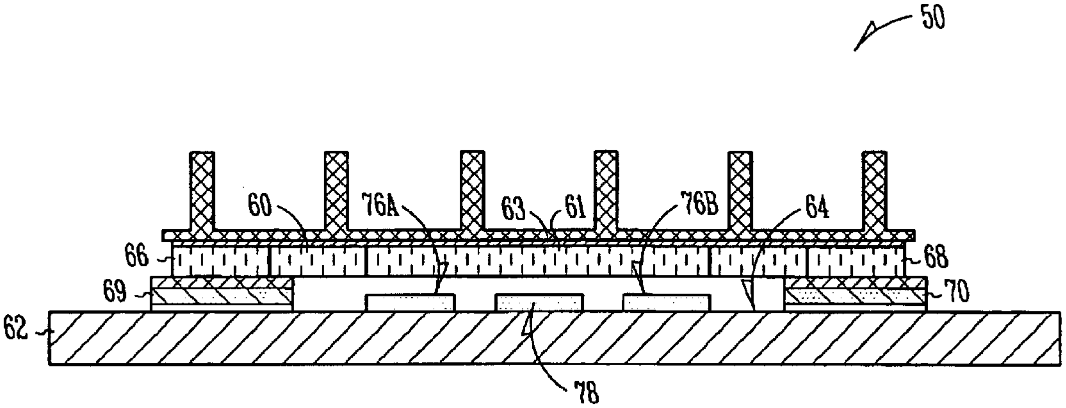
FIG. 5 is a cross-sectional view illustrating another embodiment of a MEMS switch of the present invention.

FIG. 5 shows another embodiment of a MEMS switch 50 of the present invention. MEMS switch 50 includes a beam 60 that is similar to beam 40 described above, but beam 60 is fixed to a substrate 62 at both ends 66, 68. The ends 66, 68 of beam 60 are attached by conductive pads 69, 70 to substrate 62. Actuation electrodes 76A, 76B are arranged on an upper surface 64 of substrate 62 between conductive pads 69, 70. A signal contact 78 is mounted between actuation electrodes 76A, 76B on the upper surface 64 of substrate 62.

During operation, beam 60 is electrostatically deflected by the actuation electrodes 76A, 76B so that a conducting portion 61 of beam 60 engages signal contact 78 and establishes an electrical connection between the beam 60 and the substrate 62. MEMS switch 50 is also capable of high-speed switching because the beam 60 includes a hexsil structural portion 63 that is similar to the hexsil structural portion 48 in the beam 40 described above.

In any embodiment the height of any actuation electrode may be less than that of any signal contact so that the beam does not inadvertently engage the actuation electrode when the beam is deflected. The actuation electrodes and signal contacts may be arranged perpendicular to the longitudinal axis of the beam, parallel to the longitudinal axis of the beam, or have any configuration that facilitates high-speed switching. The beam in the MEMS switch can also have any shape as long as the beam has a resonance frequency that is adequate for a particular MEMS switch.

Figure 6A:
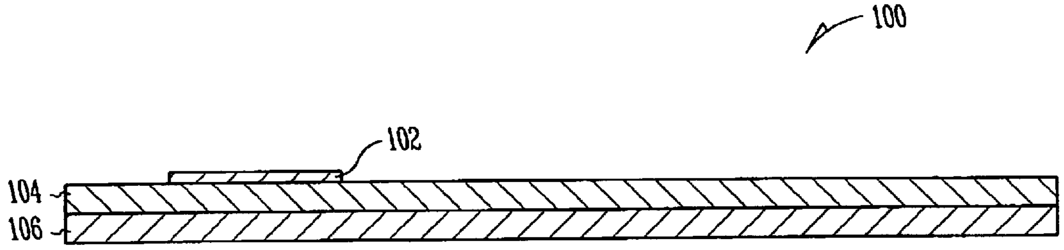
FIGS. 6A–6C are cross-sectional views of a substrate formed by the method of the present invention.
Figure 6B:
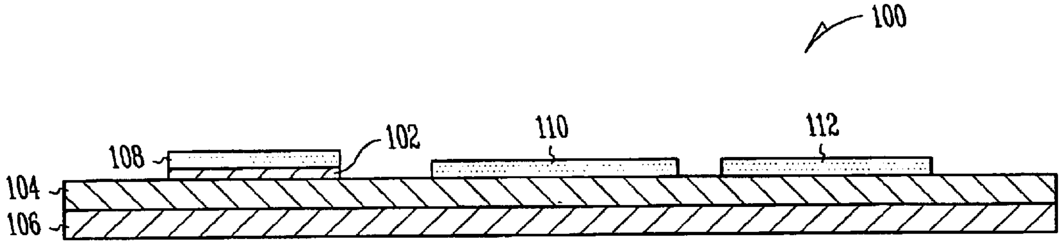
Figure 6C:
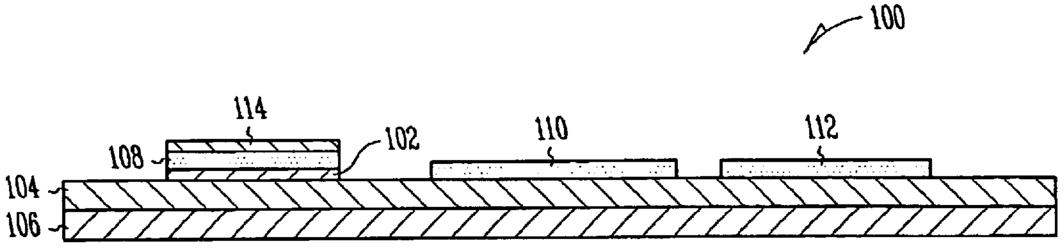

The method of the present invention includes separately forming a substrate 100 and a beam 200, and then attaching the beam 200 to the substrate 100 to form a MEMS switch 300. FIGS. 6A–6C illustrate fabricating a substrate 100 that is part of MEMS switch 300. FIG. 6A shows patterning a first dielectric layer 102 onto a second dielectric layer 104 that overlies a base 106. FIG. 6B shows patterning a conductive layer that has been deposited onto the dielectric layers 102, 104 to form a conductive pad 108, an actuation electrode 110 and a signal contact 112. FIG. 6C shows patterning a wetting layer 114 that has been deposited onto the conductive pad 108.

Figure 7A:
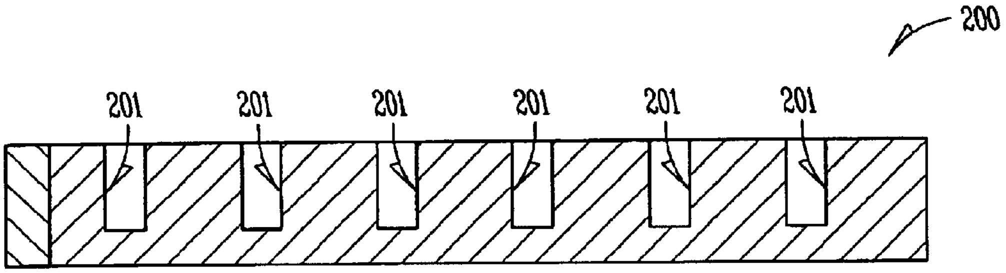
FIGS. 7A–7E are cross-sectional views of a beam formed by the method of the present invention.
Figure 7B:
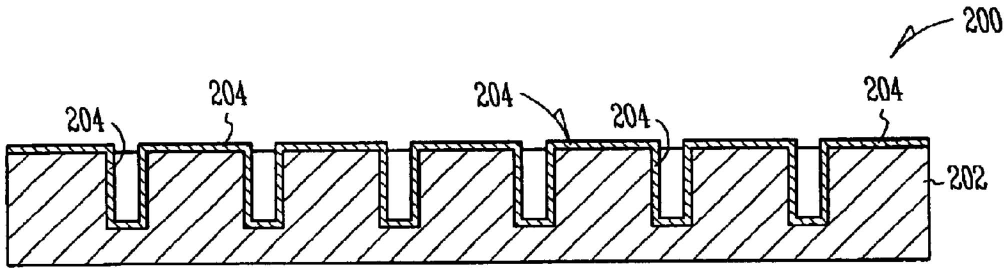
Figure 7C:
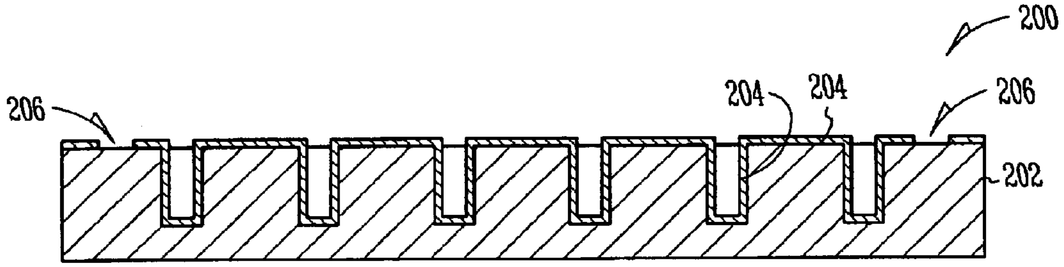
Figure 7D:
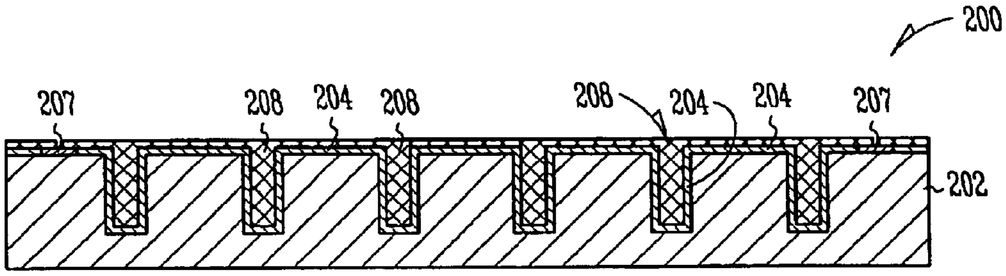
Figure 7E:
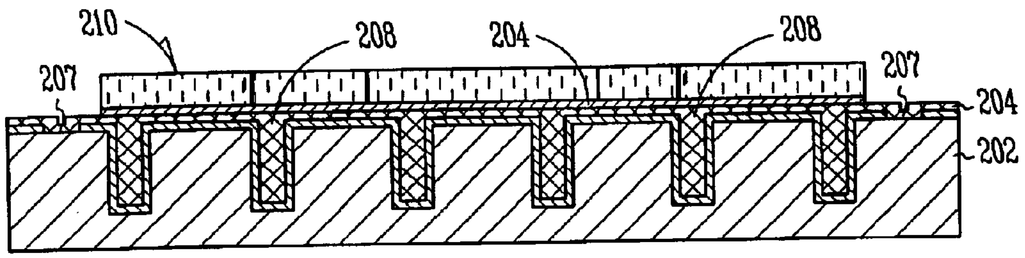
Figure 7F:
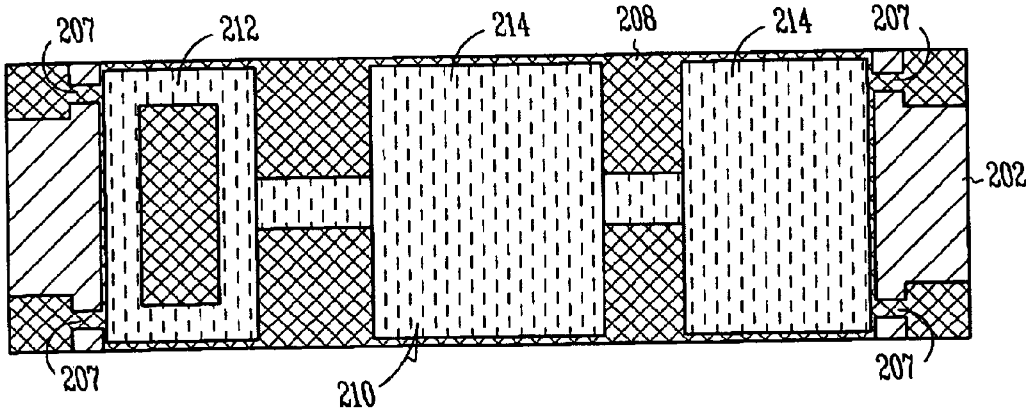
FIG. 7F is a top view of the beam shown in FIG. 7E.
Figure 7G:
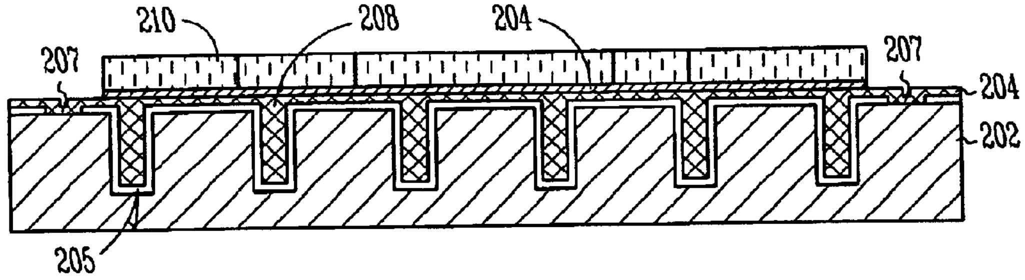
FIG. 7G is another cross-sectional view of the beam formed by the method of the present invention.

FIGS. 7A–7G illustrate fabricating a beam 200. FIG. 7A shows etching a pattern 201, preferably in hexsil configuration, into a ceramic body 202. FIG. 7B shows depositing a release layer 204, such as silicon dioxide, over the ceramic body 200. In one embodiment the release layer 204 has a thickness anywhere from 1 to 2 microns. FIG. 7C shows etching anchor openings 206 into the release layer 204. FIG. 7D shows depositing a structural layer 208 onto the body 202 such that the structural layer 208 (i) extends into the pattern in the body 202; (ii) covers the release layer 204; and (iii) extends into the anchor openings 206 to form tethers 207. In one embodiment the structural layer 208 is polysilicon. FIG. 7E shows depositing a conductive layer 210 onto the structural portion 208. In one embodiment the conductive layer 210 may be anywhere from 0.5 microns to 2 microns thick. FIG. 7F is a top view of the beam 200 shown in FIG. 7E and illustrates conductive layer 210 after it has been etched to form a bonding pad 212 and interconnected contacts 214. FIG. 7G shows the beam 200 after the release layer 204 has been removed. Depending on the material of the release layer 204, it is removed by etching, dissolving or other techniques.

Figure 8:
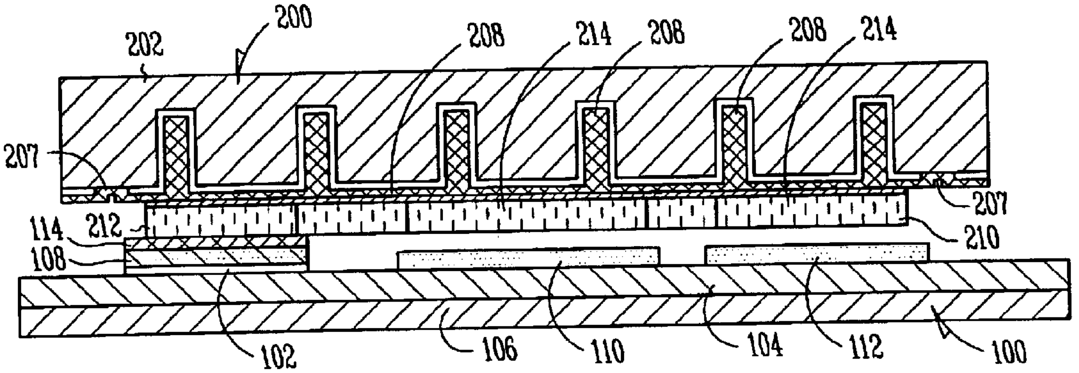
FIG. 8 is a cross-sectional view illustrating the beam attached to the substrate.

FIG. 8 shows flipping the beam 200 over and coupling the bonding pad 212 on beam 200 to the conductive pad 108 on substrate 100. Beam 200 and substrate 100 may be bonded together using any technique, including techniques that are used in flip-chip bonding. Beam 200 and/or substrate 100 may also include alignment portions (not shown) that facilitate manually or mechanically aligning the beam 200 relative to the substrate 100 as the beam 200 is coupled to the substrate 100.

Figure 9:
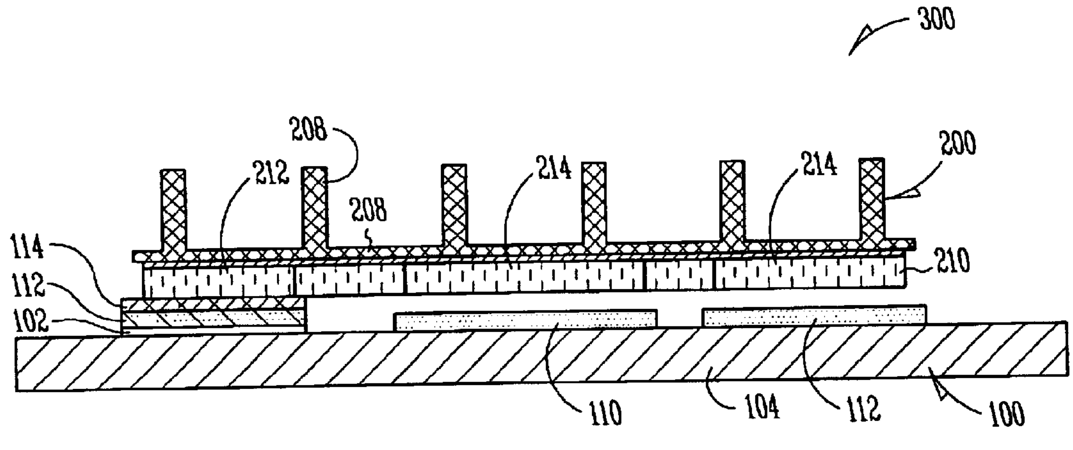
FIG. 9 is a cross-sectional view of a MEMS switch manufactured according to the method of the present invention.

FIG. 9 shows the beam 200 after it has been removed from the body 202 by breaking the thin tethers 207 that hold the beam 200 to body 202. The result is the formation of a high resonance frequency cantilevered beam 200. Although a MEMS switch 300 illustrated in FIGS. 6–9 includes a cantilevered beam 200, it should be noted that that a MEMS switch with a bridge beam may be made in a manner similar to the cantilevered beam 200 shown in FIGS. 6–9.

MEMS switches have intrinsic advantages over traditional solid state switches, such as superior power efficiency, low insertion loss and excellent isolation. The MEMS switch 300 produced with the method invention is highly desirable because the MEMS switch 300 is integrated onto a substrate 100 that maybe part of another device such as filters or CMOS chips. The tight integration of the MEMS switch 300 with the chip reduces power loss, parasitics, size and costs.

Figure 1:
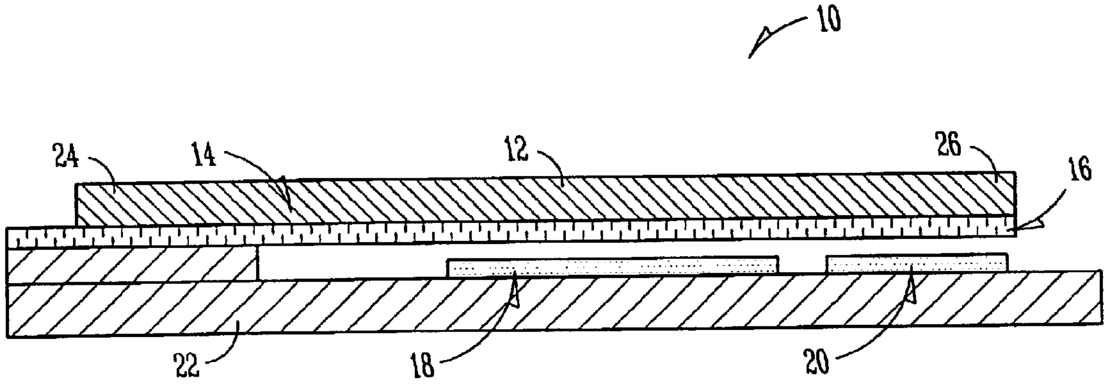
Fig. 1 PRIOR ART
FIG. 1 illustrates a prior art MEMS switch that includes a cantilever beam.
Figure 2:
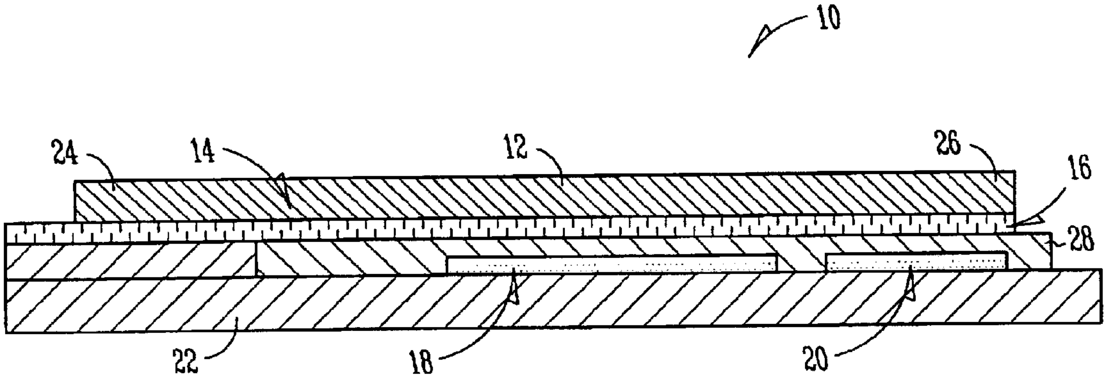
Fig. 2 PRIOR ART
FIG. 2 illustrates the prior art MEMS switch of FIG. 1 during fabrication.

The release process that is used to make MEMS switches often limits the material selection for the contacts and electrodes that are used in the switches to acid-resistant metals such as gold. The prior art switch 10 illustrated in FIG. 1 includes various contacts 16, 18, 20 on the beam 12 and base 22 that must withstand the same release process. Therefore, they are normally made from the same metal. As stated previously, because contacts that are made from the same metal tend to bond each other, the switch 10 will sometimes not open after being closed.

The contacts 110, 112 on substrate 100 and the contacts 214 on beam 200 are made on two separate wafers and then bonded together to form MEMS switch 300. Beam 200 goes through the release process, but substrate 100 does not. Therefore, the contacts 110, 112 on substrate 100 can be made using standard technology increasing the types of materials that are available for the contacts 110, 112. Since the contacts 110, 112 on the substrate 100 may be made from an assortment of materials, the contacts on beam 200 and substrate 100 are more readily made from different materials such as gold on the beam 200 and aluminum, nickel, copper or platinum on the substrate 100.

The operations discussed above with respect to the described methods may be performed in a different order from those described herein. Also, it will be understood that the method of the present invention may be performed continuously.

Figure 10:
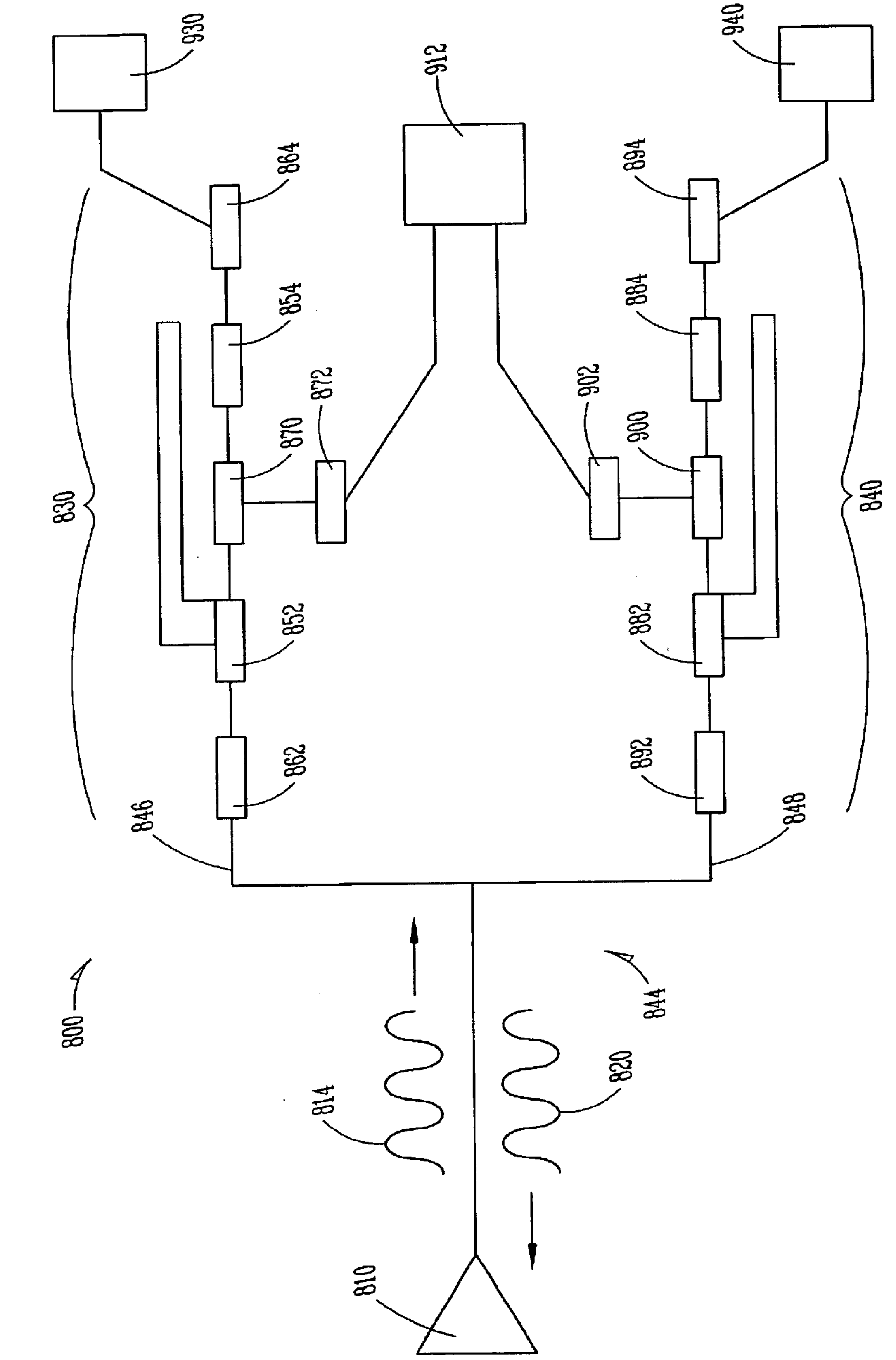
FIG. 10 is a schematic circuit diagram illustrating MEMS switches of the present invention in an example wireless communication application.

FIG. 10 shows a schematic circuit diagram of a MEMS-based wireless communication system 800. System 800 includes an antenna 810 for receiving a signal 814 and transmitting a signal 820. System 800 also includes first and second MEMS switches 830 and 840 that are electrically connected to antenna 810 via a branch circuit 844. Branch circuit 844 includes a first branch wire 846 and a second branch wire 848. MEMS switch 830 includes first and second electrical contacts 852 and 854 electrically connected to respective bond pads 862 and 864, and an actuation elecrode 870 electrically connected to a bond pad 872. MEMS switch 840 includes similar first and second electrical contacts 882 and 884 electrically connected to respective bond pads 892 and 894, and an actuation elecrode 900 electrically connected to a bond pad 902. First branch wire 846 is connected to MEMS switch 830 via bond pad 862, while second branch wire 848 is connected to MEMS switch 840 via bond pad 892. MEMS switches 830 and 840 may be any one of the MEMS switches discussed in detail above.

System 800 further includes a voltage source controller 912 that is electrically connected to MEMS switches 830 and 840 via respective actuation elecrode bond pads 872 and 902. Voltage source controller 912 includes logic for selectively supplying voltages to actuation elecrodes 870 and 900 to selectively activate MEMS switches 830 and 840.

System 800 also includes receiver electronics 930 electrically connected to MEMS switch 830 via bond pad 864, and transmitter electronics 940 electrically connected to MEMS switch 840 via bond pad 894. During operation the system 800 receives and transmits wireless signals 814 and 820. Receiving and transmitting signals is accomplished by voltage source controller 912 selectively activating MEMS switches 830 and 840 so that received signal 814 can be transferred from antenna 810 to receiver electronics 930 for processing, while transmitted signal 820 generated by transmitter electronics 840 can be passed to antenna 810 for transmission. An advantage of using MEMS switches rather than semiconductor-based switches in the present application is that MEMS switches minimize transmitter power leakage into sensitive and fragile receiver circuits.

FIGS. 1–10 are representational and are not necessarily drawn to scale. Certain proportions thereof may be exaggerated, while others may be minimized. FIGS. 3–10 illustrate various implementations of the invention that can be understood and appropriately carried out by those of ordinary skill in the art.

What is claimed is:

1. A method of fabricating a MEMS switch, comprising:

forming a substrate that includes a contact;

forming a hexsil beam separately from the substrate; and attaching the hexsil beam to the substrate such that the beam is maneuverable into and out of contact with the substrate.

2. The method of claim 1, further comprising forming conductive traces in the substrate and a signal contact on the substrate that is electrically coupled to the conductive traces.

3. The method of claim 1, wherein forming a beam includes etching a pattern into a body.

4. The method of claim 3, wherein forming a beam includes depositing a release layer onto the body.

5. The method of claim 4, wherein forming a beam includes etching the release layer to expose a portion of the body.

6. The method of claim 5, wherein forming a beam includes depositing a structural layer onto the release layer and the exposed portion of the body.

7. The method of claim 6, wherein forming a beam includes depositing and patterning a metal layer onto the structural layer to form a bonding pad and a contact on the structural layer.

8. The method of claim 7, wherein forming a beam includes removing the release layer.

9. The method of claim 8, wherein attaching the beam to the substrate includes securing the bonding pad to the substrate.

10. The method of claim 9, wherein forming a beam includes separating the structural layer from the body.

11. The method of claim 10, wherein etching the pattern into the body includes etching a hexsil pattern into the body.

12. A method of fabricating a MEMS switch, comprising:

forming a substrate that includes a contact and a plurality of traces electrically coupled to the contact;

etching a pattern into a body that is separate from the substrate;

depositing a release layer over the body;

etching the release layer to expose a portion of the body, wherein etching the pattern into the body includes etching a hexsil pattern into the body;

depositing a structural layer onto the release layer and the exposed portion of the body;

depositing and patterning a metal layer onto the structural layer to form a bonding pad and a contact on the structural layer;

removing the release layer;

attaching the bonding pad to the substrate; and separating the structural layer from the body to form a hexsil beam that engages and disengages the contact on the substrate when an actuation voltage is applied to the switch.

13. The method of claim 12, further comprising forming an actuation electrode on the substrate.

14. The method of claim 12, wherein the substrate is a chip.

15. A method of fabricating a MEMS switch, comprising:

forming a substrate that includes a contact;

forming a hexsil beam; and attaching the beam to the substrate such that the beam is maneuverable into and out of contact with the substrate.

16. The method of claim 15, wherein the substrate is a chip.

17. The method of claim 15, wherein forming a hexsil beam comprises:

etching a hexsil pattern into a body;

depositing a release layer onto the body;

etching the release layer to expose a portion of the body;

depositing a structural layer onto the release layer and the exposed portion of the body;

depositing and patterning a metal layer onto the structural layer to form a bonding pad and a contact on the structural layer; and removing the release layer.

18. A method of fabricating a MEMS switch, comprising:

forming a substrate that includes a contact;

forming a beam separately from the substrate; and attaching the beam to the substrate such that the beam is maneuverable into and out engagement with the contact on the substrate.

19. The method of claim 18, further comprising forming conductive traces in the substrate and a signal contact on the substrate that is electrically coupled to the conductive traces.

20. The method of claim 18, further comprising forming an actuation electrode on the substrate.

21. A method of fabricating a MEMS switch, comprising:

forming a substrate that includes a contact and a plurality of traces electrically coupled to the contact;

etching a pattern into a body that is separate from the substrate;

depositing a release layer over the body;

etching the release layer to expose a portion of the body;

depositing a structural layer onto the release layer and the exposed portion of the body;

depositing and patterning a metal layer onto the structural layer to form a bonding pad and a contact on the structural layer;

removing the release layer;

attaching the bonding pad to the substrate; and separating the structural layer from the body to form a beam that engages and disengages the contact on the substrate when an actuation voltage is applied to the switch.

22. The method of claim 21, further comprising forming an actuation electrode on the substrate.

23. The method of claim 21, wherein the substrate is a chip.

* * * * *